United States Patent [19]

Izumi

[11] Patent Number: 6,057,504
[45] Date of Patent: May 2, 2000

[54] HYBRID SOLAR COLLECTOR FOR GENERATING ELECTRICITY AND HEAT BY SEPARATING SOLAR RAYS INTO LONG WAVELENGTH AND SHORT WAVELENGTH

[76] Inventor: Hisao Izumi, 297, Nakashinano-cho, Seto-shi, Aichi-ken, Japan

[21] Appl. No.: 08/809,705

[22] PCT Filed: Oct. 3, 1995

[86] PCT No.: PCT/JP95/02018

§ 371 Date: Apr. 4, 1997

§ 102(e) Date: Apr. 4, 1997

[87] PCT Pub. No.: WO96/11364

PCT Pub. Date: Apr. 18, 1996

[30] Foreign Application Priority Data

| Oct. 5, 1994 | [JP] | Japan | 6-278219 |
| Apr. 27, 1995 | [JP] | Japan | 7-141047 |
| May 9, 1995 | [JP] | Japan | 7-146697 |

[51] Int. Cl.$^7$ .................................................. H01L 27/142
[52] U.S. Cl. ........................................... 136/246; 136/248
[58] Field of Search ..................... 136/245, 246, 136/248

[56] References Cited

U.S. PATENT DOCUMENTS

| 4,700,013 | 10/1987 | Soule | 136/248 |
| 4,771,764 | 9/1988 | Clutt | 136/246 |
| 5,269,851 | 12/1993 | Horne | 136/246 |
| 5,658,448 | 8/1997 | Lasich | 136/246 |

FOREIGN PATENT DOCUMENTS

| 0019016 | 11/1980 | European Pat. Off. . |
| 1764427 | 7/1971 | Germany . |

OTHER PUBLICATIONS

Patent Abstracts of Japan, Vo. 012, No. 255, p. 732, Ju.1 19, 1988, & JP 63 044612 A, Feb. 25, 1988.

*Primary Examiner*—John Goodrow

[57] ABSTRACT

To conduct generating electricity and heating by utilizing solar rays, the solar rays are separated to short wavelength and long wavelength which are separately converged to increase the efficiency of generating and heating. To separate the sunlight, it is preferable to use a semi-transparent mirror for reflecting the short wavelength and for passing the long wavelength. Further, it is preferable that the semi-transparent mirror may act as an optical system for converging the short wavelength.

15 Claims, 15 Drawing Sheets ions and appended claims.

HYBRID SOLAR COLLECTOR FOR GENERATING ELECTRICITY AND HEAT BY SEPARATING SOLAR RAYS INTO LONG WAVELENGTH AND SHORT WAVELENGTH

BACKGROUND OF THE INVENTION

1. Field of the Invention

The present invention relates to a solar collector for generating electricity and heat, and more particularly to a hybrid solar collector for converting solar energy of short wavelength into electric energy and converting solar energy of long wavelength into heat. The solar rays are separated into short wavelength and long wavelength. Separated short wavelength ray is focused on a solar cell for converting the energy of the short wavelength into electric energy, and separated long wavelength ray is focused on a pipe for heating a liquid inside the pipe by the energy of the long wavelength ray.

2. Description of Related Art

As a solar energy collector for generating electric energy, a solar panel is well known. The solar panel is constituted of solar cells arranged in planar form. Further, a large-scale solar collector is also known. Such a solar collector is constituted of a large number of reflector mirrors distributed on the ground for converging solar rays at a converging point, and a solar cell arranged at the converging point.

On the other hand, a solar collector for generating heat is well known. Such a solar collector is constituted of reflector mirrors for converging solar rays, and a heat absorbing tube arranged at a converging point.

Moreover, another solar collector for generating electricity and heat has been proposed. The hybrid solar collector utilizes a solar cell arranged at a solar rays converging point and a heat absorbing tube located on a rear surface of the solar cell.

SUMMARY OF THE INVENTION

In the conventional hybrid solar collector for generating electricity and heat, a heat absorbing tube having a function of cooling a solar cell cannot be heated up to high temperatures. This is because efficiency of the solar cell drastically decreases when the solar cell is heated up to high temperatures. Thus, the hybrid solar collector may produce only warm water having temperatures from 40 to 50° C. at the highest. Also, the efficiency of the solar cell cannot be sufficiently increased.

The present invention realizes a new hybrid collector for generating electricity and heat at high efficiency. In the hybrid collector of the invention, solar rays are separated into two portions, one of which has a wavelength suitable for generating electricity by the solar cell (mainly the visible and shorter wavelength, or preferably, a wavelength not greater than 9000 angstrom; which is referred to as "short ray" hereinafter) and the other of which has a wavelength suitable for heating (mainly the infrared ray; which is referred to as "long ray" hereinafter).

The hybrid collector of the invention comprises a separating device for separating solar rays into short ray and long ray. The separating device is incorporated in an optical system for converging solar rays. Further, the solar cell is arranged at a converging point of the short ray, and the heat absorbing tube is arranged at a converging point of the long ray.

Preferably, a semi-transparent mirror which reflects the short ray and which transmits the long ray is suitably used as the separating device. The semi-transparent mirror is, for example, constituted of a glass plate on which a thin film of silicone is deposited. Additionally, it is preferable that the separating device also has a function for converging the short ray on the solar cell.

The present invention will be more fully understood form the following embodiments and appended claims.

DESCRIPTION OF THE PREFERRED EMBODIMENTS

Described hereinafter described are preferred embodiments of a hybrid solar collector which separates solar rays into short ray and long ray and converges separated short ray and long ray, respectively. A solar cell is provided at the converging point of the short ray and a heat absorbing tube is provided at the converging point of the long ray.

Figure 1:
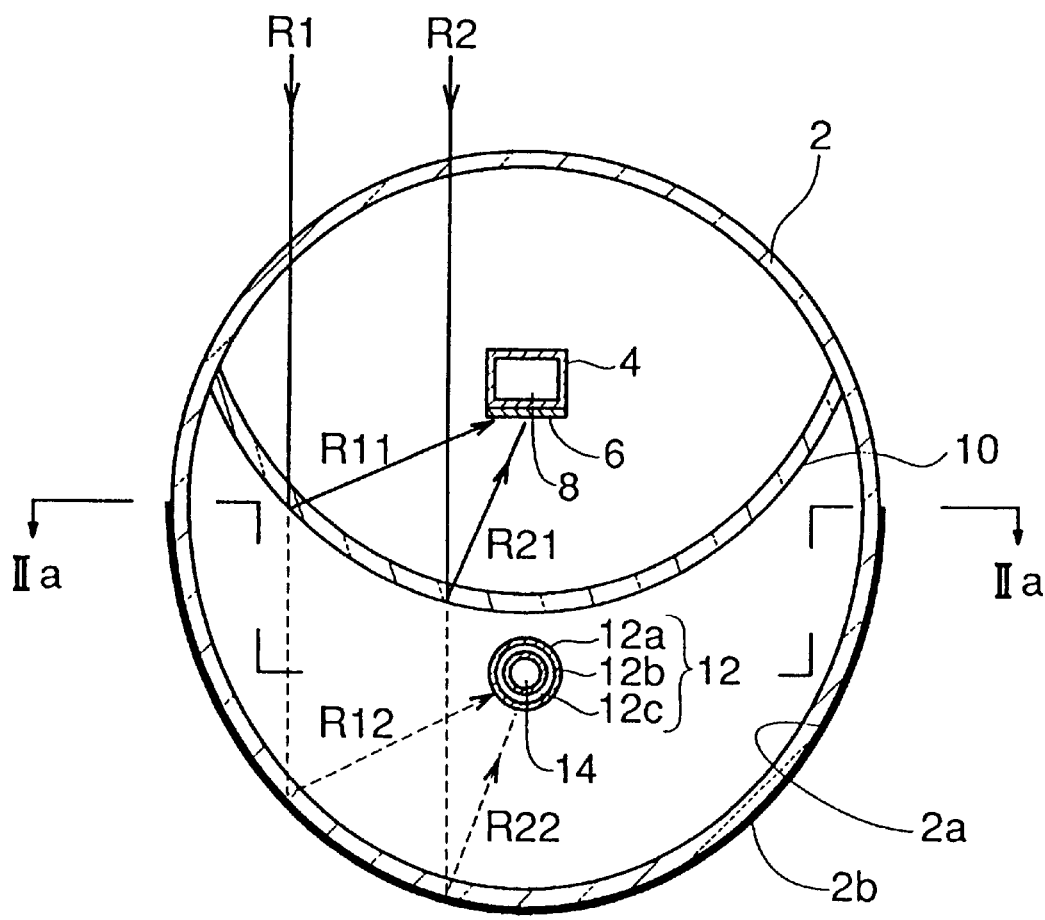
FIG. 1 shows a transverse sectional view of a hybrid solar collector according to a first embodiment.

FIG. 1 shows a transverse sectional view of a hybrid solar collector according to a first embodiment. The reference number 2 in the drawing represents a transparent glass pipe which is formed of tempered glass. The glass pipe 2 is constituted of an upper half having a circular surface in cross section and a lower half having a parabolic surface 2*a* in cross section. The parabolic surface 2*a* is vapor deposited with an aluminum coating 2*b* to reflect the long ray. The parabolic surface 2*a* has a focal point where a heat absorbing tube 12 is disposed. The heat absorbing tube 12 is a double tube constituted of an inner tube 12*b* and an outer tube 12*a*.

The inner and outer tubes 12b and 12a have a vacuum clearance 12c therebetween so that the inner tube 12b is insulated from environment. The inner tube 12b has an outer wall surface which is painted in black to absorb the heating energy of the long ray at high efficiency. A heat-transfer medium 14 such as polyethylene glycol passes through the inner tube 12b. The polyethylene glycol can be heated up to hundreds of degrees and also exhibits an anti-freezing property.

A parabolic mirror 10 is located above the heat absorbing tube 12. The parabolic mirror 10 is vapor deposited with a plurality of thin films of silicone. The parabolic mirror 10 reflects the short ray mainly constituted of the visible and shorter wavelength and transmits the long ray mainly constituted of the infrared ray. Strictly speaking, the parabolic mirror 10 reflects the solar ray having a wavelength not greater than 9000 angstrom and transmits the solar ray having a wavelength greater than 9000 angstrom. A solar cell 6 is positioned at a focal point (strictly speaking, a position slightly lower than the focal point) of the parabolic mirror 10. The solar cell 6 is fixedly mounted on a lower surface of an aluminum tube 4 having a rectangular cross-sectional configuration. The aluminum tube 4 is supplied with cooling water 8 for cooling the solar cell 6.

The short rays R11 and R21 in the solar rays R1 and R2 are reflected by the parabolic mirror 10, to thereby be converged on the solar cell 6. The long rays R12 and R22 in the solar rays R1 and R2 transmit the parabolic mirror 10 and are then reflected by the lower surface of the glass pipe 2, to thereby be converged on the heat absorbing tube 12. Since the short ray converged on the solar cell 6 does not include the infrared ray, the solar cell 6 is easily kept at low temperatures. Additionally, the solar cell 6 is effectively cooled down by the cooling water 8.

Figure 2:
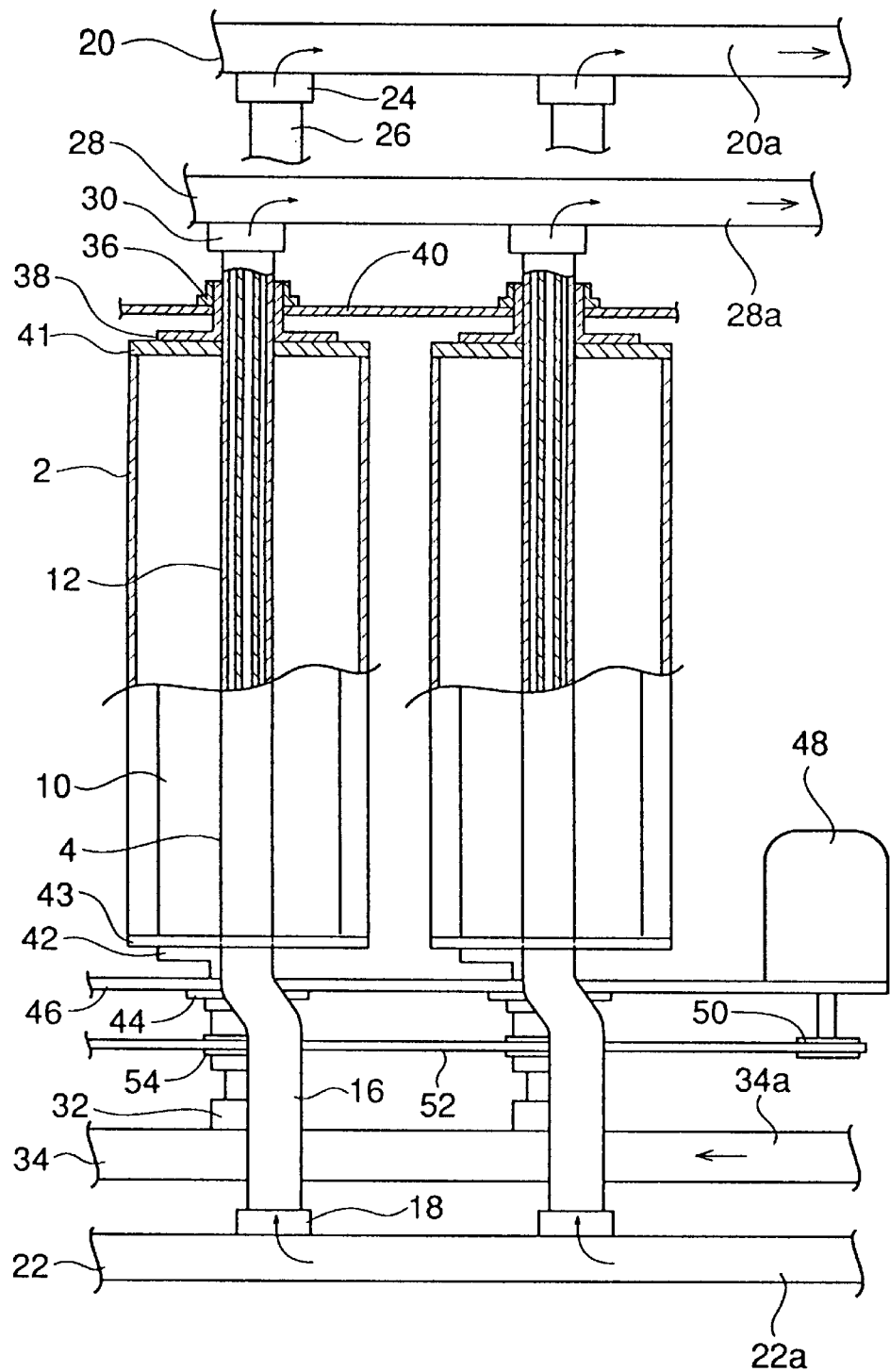
FIG. 2 shows a partial plan view of a solar energy converting system utilizing the hybrid solar collector according to the first embodiment.

As shown in FIG. 2, the glass tube 2 is closed by end plates 41 and 43 at both ends thereof. The end plates 41 and 43 are adapted to retain the aluminum tube 4, the parabolic mirror 10 and the heat absorbing tube 12 in a positional relationship as shown in FIG. 1. The end plates 41 and 43 are fixedly provided with hollow axes 38 and 42, respectively, through which the aluminum tube 4 and the heat absorbing tube 12 are outwardly extended. The aluminum tube 4 and the heat absorbing tube 12 are bent upwardly or downwardly as viewed in FIG. 1 at portions closed to the end plates 41 and 43, so as to align the hollow axes 38 and 42 mounted on substantially middle portions of the end plates 41 and 43.

The hollow axis 38 is rotatably supported on a fixture frame 40 through a bearing 36. The fixture frame 40 is mounted on a desired location such as a roof of a factory. Similarly, the hollow axis 42 is supported on a fixture frame 46 through a bearing 44. The axis 42 is fixedly provided with a sprocket 54 around which a chain 52 is wrapped. The chain 52 also engages a sprocket 50 connected to a motor 48, so that the glass pipe 2 rotates when the chain 52 is moved by the motor 48 and the sprocket 50. The motor 48 is controlled by a sensing signal representative of a sensing direction of the sun, so that the glass pipe 2 normally keeps a position shown in FIG. 1, that is, the incident solar rays are always parallel with the symmetry axis in FIG. 1.

The heat absorbing tube 12 outwardly extending through the hollow axes 38 and 42 is coupled to a pipe 28 by a coupling 30 at an upper end as viewed in FIG. 2, and is coupled to a pipe 34 by a coupling 32 at a lower end as viewed in FIG. 2. The couplings 30 and 32 rotatably couple the heat absorbing tube 12 to the pipes 28 and 34, respectively. The aluminum tube 4 extending through the glass pipe 2 communicates with hoses 26 and 16 which are coupled to cooling water feeder tubes 20 and 22 by couplings 24 and 18, respectively. It is to be noted that though partly shown in FIG. 2, a number of glass pipes 2 are disposed in parallel on the fixture plates 40 and 46.

Figure 3:
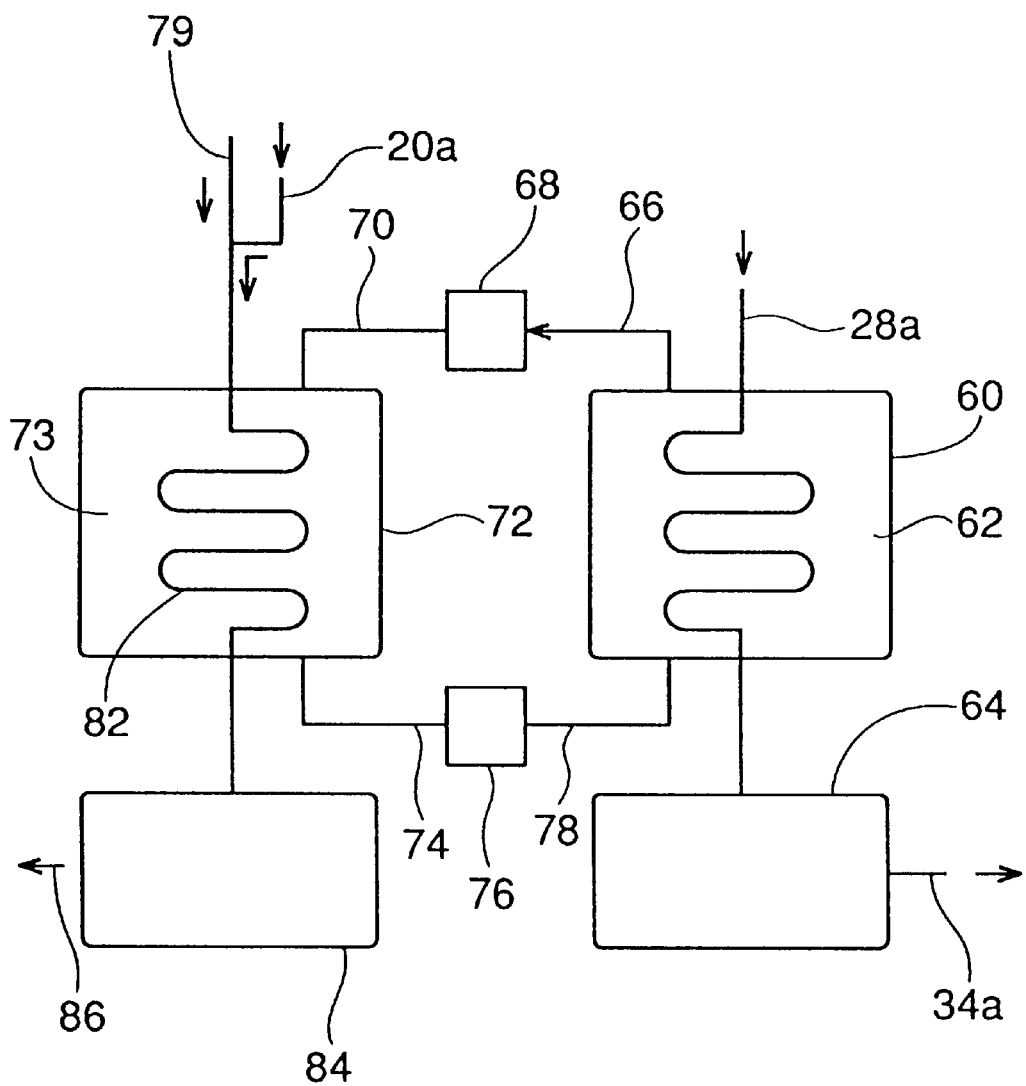
FIG. 3 schematically shows a circulation system of a heat-transfer medium.

FIG. 3 schematically shows a heat-transfer medium circulation system. The heat-transfer medium 14 is introduced into a pressure tank 60 through a portion designated by the numeral 28a, thereby heating a medium 62 reserved in the pressure tank 60. The medium 62 has a low boiling point. The heat-transfer medium 14 releases heat energy therefrom by heating the medium 62 and is returned to a recovery tank 64 for reuse, as designated by the numeral 34a in FIGS. 3 and 2.

The medium 62 having low boiling point vaporizes to produce vapor in the pressure tank 60. The vapor passes through passages 66 and 70 and is injected into a cooling tank 72. The vapor stream rotates a turbine 68, thereby generating electricity. The cooling tank 72 receives therein a pipe 82 into which the cooling water is introduced, so that the vapor is again liquefied to produce liquid 73. The liquefied medium 73 is returned to the pressure tank 60 through passages 74 and 78 by a pressure pump 76.

The cooling water heated by cooling the medium 73 in the cooling tank 72 is discharged into a warm water reservoir tank 84, and is then introduced through a conduit 86 to various facilities where warm water is required. In the drawing, an inlet port for tap water is designated by the numeral 79. Further, as designated by the numeral 20a, the water warmed during passing through the aluminum pipe 4 is returned to the warm water reservoir tank 84.

The operation of the solar energy converting system thus constructed will now be described. As described above, since the motor 48 is controlled by the sensing signal representative of the sensing direction of the sun, the glass pipe 2 is always kept in the position shown in FIG. 1, so that the short ray and the long ray are converged on the solar cell 6 and the heat absorbing tube 12, respectively. The short ray is condensed before entering the solar cell 6. Thus, the solar cell 6 can be of a smaller type. Additionally, the short ray converged on the solar cell 6 does not include the long ray which may excessively heat up the solar cell 6, thereby preventing reduction of converting efficiency of the solar cell 6. Moreover, in the present embodiment, the solar cell 6 is cooled by the cooling water 8. This may contribute to increase of the converting efficiency of the solar cell 6. It is preferable that the cooling water 8 is previously cooled to low temperatures. On the other hand, the long ray is condensed before irradiating the heat absorbing tube 12, thereby heating the heat-transfer medium 14 in the inner tube 12b to high temperatures. The heat-transfer medium 14 is monitored to control the flow rate thereof, so as to be heated to hundreds of degrees when it is introduced into the pressure tank 60.

The heat-transfer medium 14 heated to hundreds of degrees is, as shown in FIG. 3, utilized for generating electricity and producing warm water. This may meet the electric power needs and the warm water needs.

In the present embodiment, the hybrid solar collector has a substantially circular cross-sectional configuration. This may reduce energy for tracking the solar collector to the sun. Further, the heat-transfer medium 14 can be heated up to hundreds of degrees, thereby permitting accumulation of a great deal of heat energy in a small volume.

Second Embodiment

Figure 4:
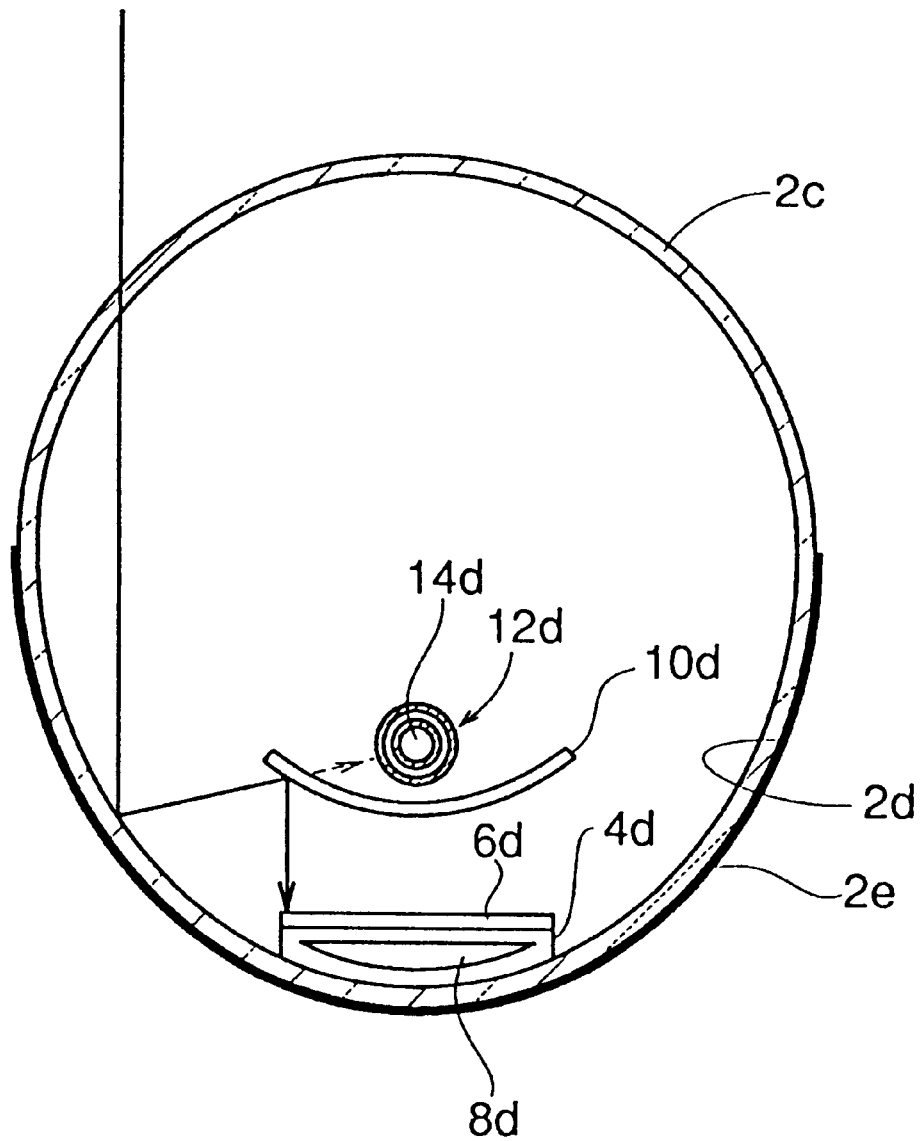
FIG. 4 shows a transverse sectional view of a hybrid solar collector according to a second embodiment.

FIG. 4 shows a transverse sectional view of a hybrid solar collector according to a second embodiment. The hybrid solar collector is enclosed in a substantially elliptical transparent glass pipe 2c. A lower half of the pipe 2c has a parabolic surface 2d in cross section. The parabolic surface 2d is provided with an aluminum coating 2e by vapor deposition to reflect the long ray and to converge it to the focal point thereof. A heat absorbing tube 12d as previously described in the first embodiment is disposed in the focal point of the parabolic surface 2d. Disposed between the parabolic surface 2d and the heat absorbing tube 12d is a convex parabolic mirror 10d on which a silicone coating is provided to transmit the long ray and to reflect the short ray. The short ray reflected by the convex parabolic mirror 10d forms a substantially parallel rays which irradiate a solar cell 6d. Disposed under the solar cell 6d is a cooling water feeder tube 4d through which cooling water 8d flows. Further, a heat-transfer medium 14d passes through the heat absorbing tube 12d.

The hybrid solar collector thus constructed is used substantially like the hybrid solar collector of the first embodiment and functions like the hybrid solar collector of the first embodiment.

Third Embodiment

Figure 5:
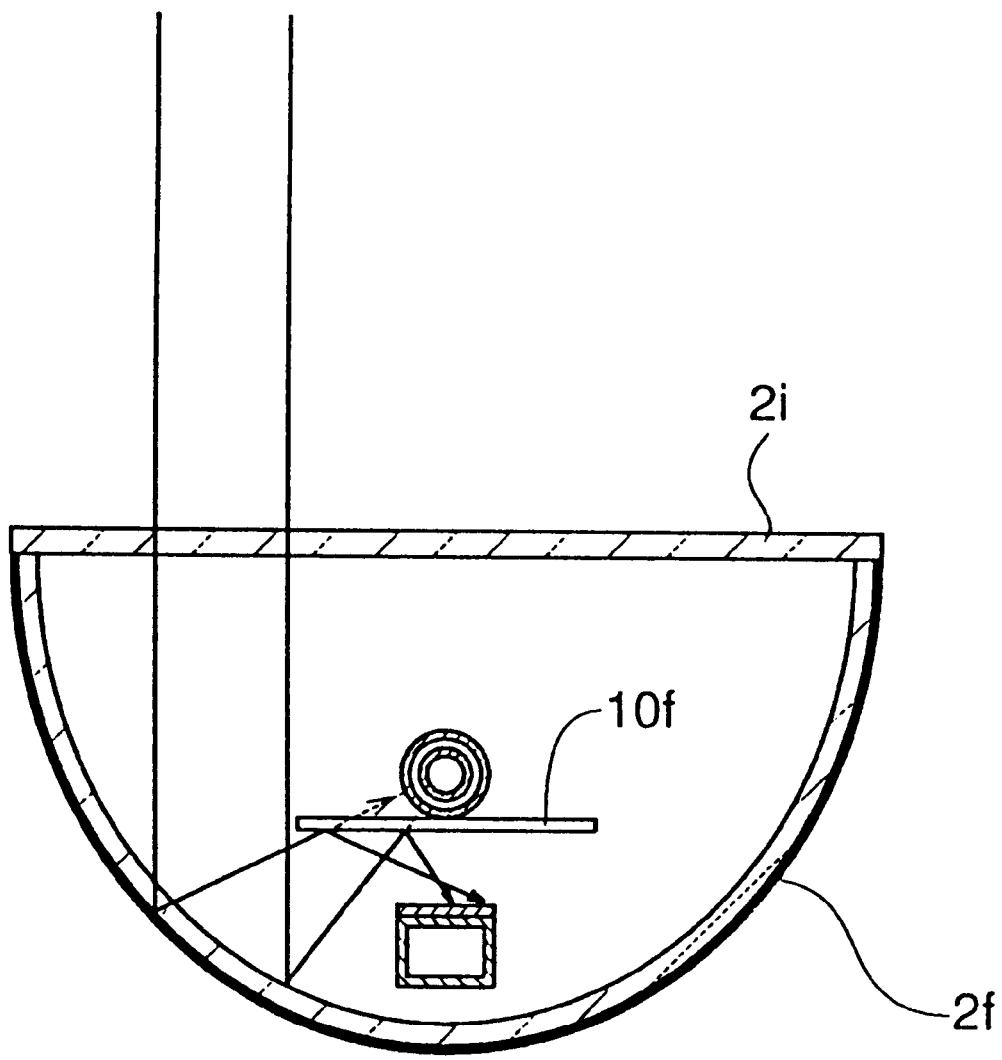
FIG. 5 shows a transverse sectional view of a hybrid solar collector according to a third embodiment.

As shown in FIG. 5, a hybrid solar collector of this embodiment is enclosed within a parabolic mirror 2f and a flat plate glass 2i received in an upper portion of the parabolic mirror 2f. A semi-transparent mirror 10f for selectively reflecting the short ray and transmitting the long ray is made of a flat plate to converge the reflected short ray to an area which is narrower than that in FIG. 4. An advantage of the hybrid solar collector of this embodiment is that the height thereof can be reduced by half.

Fourth Embodiment

Figure 6:
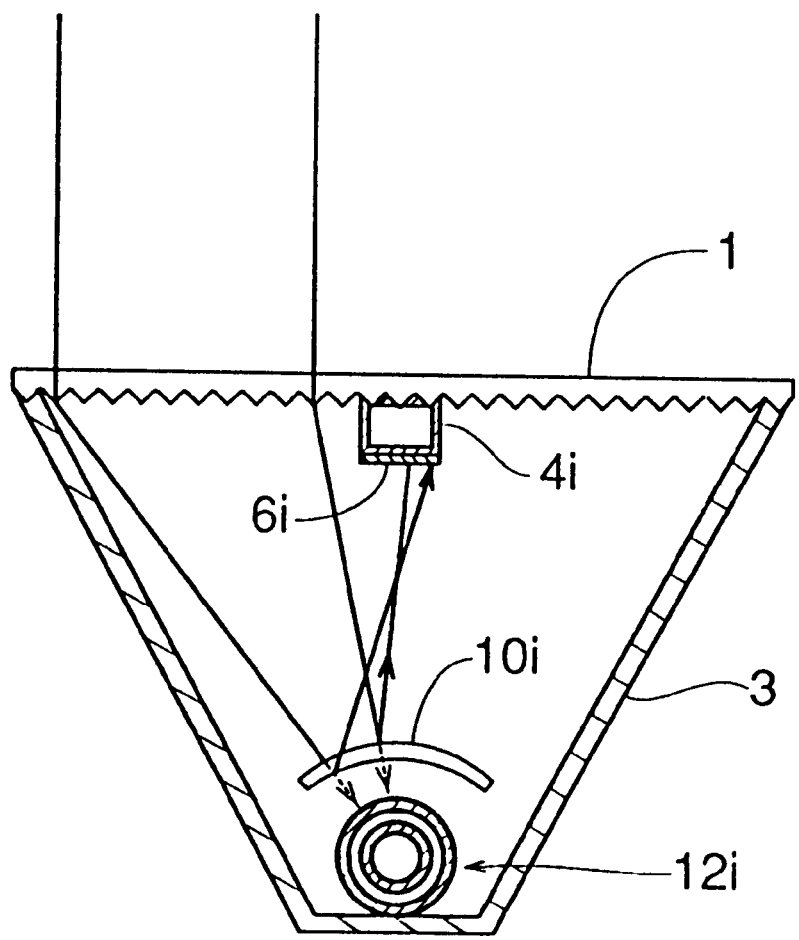
FIG. 6 shows a transverse sectional view of a hybrid solar collector according to a fourth embodiment.

FIG. 6 shows a transverse sectional view of a hybrid solar collector according to a fourth embodiment. The hybrid solar collector is constituted of a cylindrical member 3 having a quadrilateral cross-sectional configuration and having an upper opening in which a Fresnel lens 1 is fixedly received. The Fresnel lens 1 has a converging point where a heat absorbing tube 12i is disposed. A semi-transparent convex parabolic plate 10i is disposed between the Fresnel lens 1 and the heat absorbing tube 12i so as to reflect the short ray toward a solar cell 6i. A cooling water feeder tube 4i is disposed behind the solar cell 6i. The hybrid solar cell thus constructed is used substantially like the hybrid solar collector shown in FIG. 2, that is, while being tracked to the sun.

Fifth Embodiment

Figure 7:
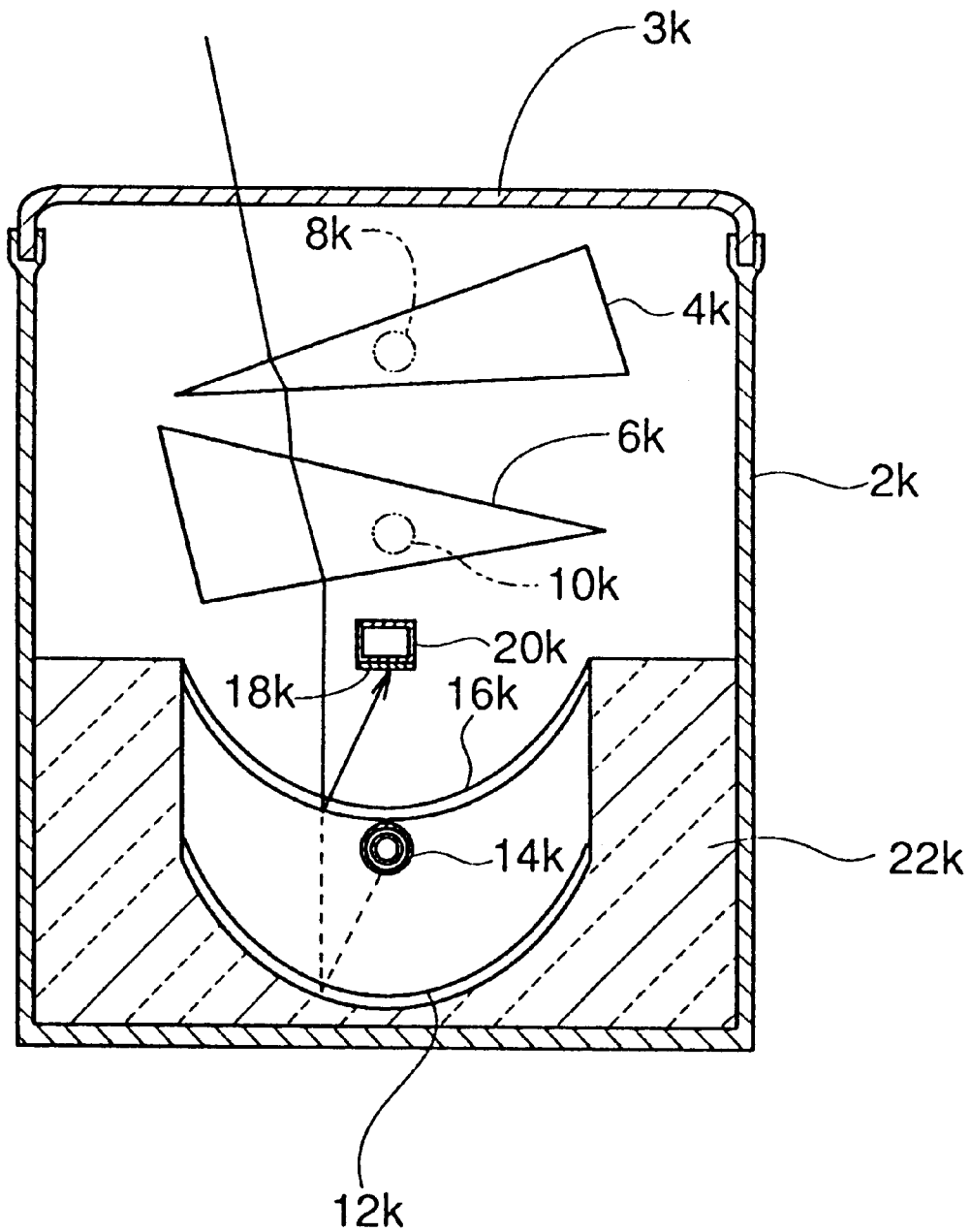
FIG. 7 shows a transverse sectional view of a hybrid solar collector according to a fifth embodiment.

FIG. 7 shows an embodiment of a box-like hybrid solar collector which extends along a line perpendicular to the surface of the drawing. A box 2k is made of corrosion resistant material such as stainless steel and is adapted to be fixed on a roof or the ground in use. The box 2k has an upper opening which is closed by a transparent glass plate 3k. A pair of triangular prisms 4k and 6k are provided and extend longitudinally along the box 2k. The first prism 4k is mounted on an axis 8k to rotate therearound. The second prism 6k is mounted on an axis 10k to rotate therearound. Respective prisms are suitably controlled so that the solar rays passing through the prisms 4k and 6k are parallel to side walls of the box 2k.

The box 2k receives a parabolic mirror 12k which is fixed on a lower portion thereof. The parabolic mirror 12k has a focal point where a heat absorbing tube 14k is disposed. Disposed above the heat absorbing tube 14k is a semi-transparent parabolic mirror 16k to reflect the short ray and transmit the long ray. A solar cell 18k is fixed at or near the focal point of the parabolic mirror 16k. A cooling water feeder tube 20k is disposed behind the solar cell 18k. In the drawing, a heat insulator is designated by the numeral 22k. The heat insulator 22k functions to preferably position the parabolic mirrors 16k and 12k.

In the fifth embodiment, the prisms 4k and 6k are moved to be directed to the sun, with the box 2k fixed.

Figure 8:
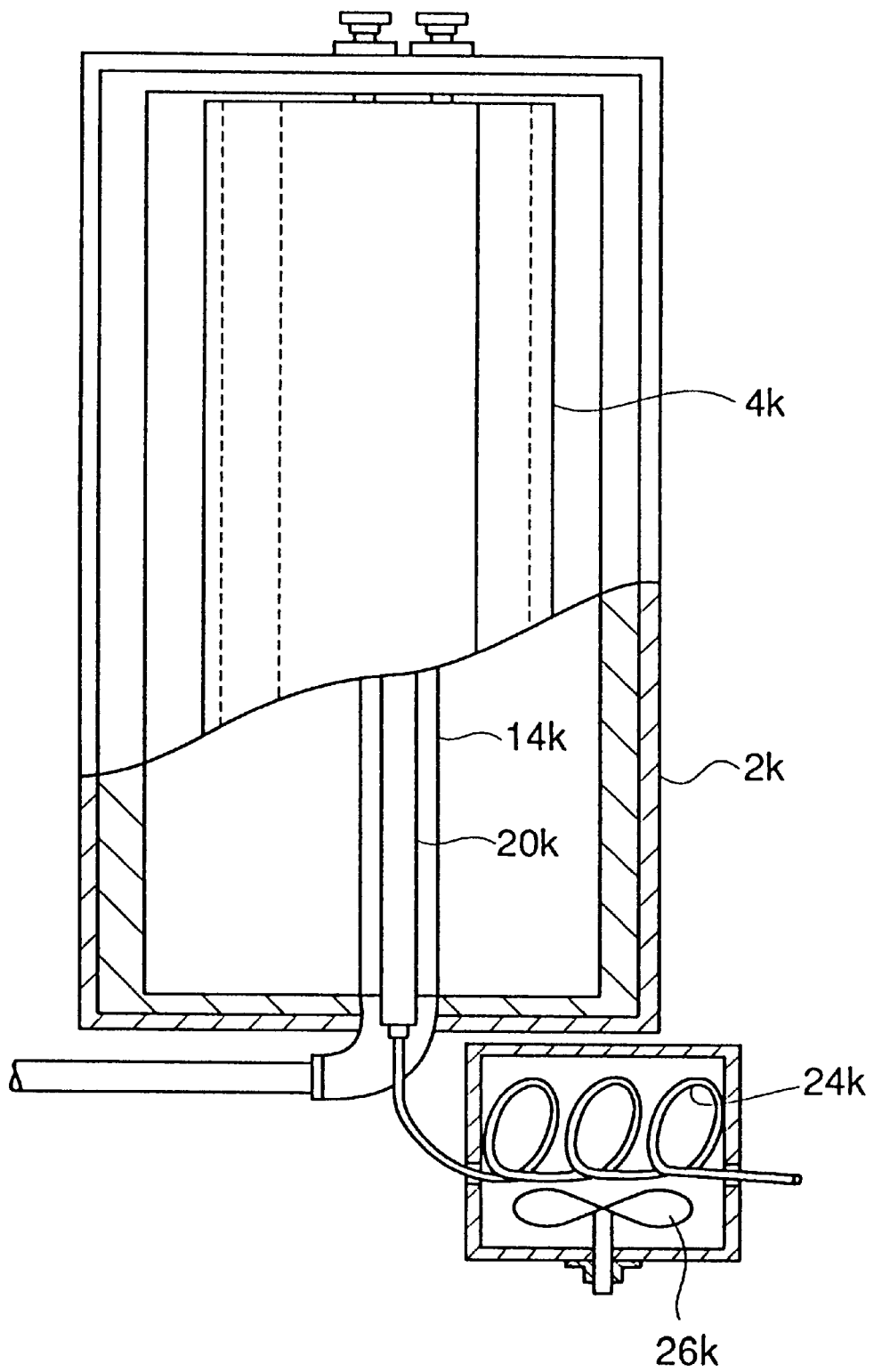
FIG. 8 shows a partial plan view of a solar energy converting system utilizing the hybrid solar collector according to the fifth embodiment.

FIG. 8 shows a plan view of the box 2k. As shown therein, cooling water is lead to a cooling tube 24k and is cooled by a fun 26k. Further, the heat absorbing tube 14k is outwardly extended and coupled to any water heating appliances. It is to be noted that a heat-transfer medium in the heat absorbing tube 14k can be directly applied to cooling and heating equipment.

Sixth Embodiment

Figure 9:
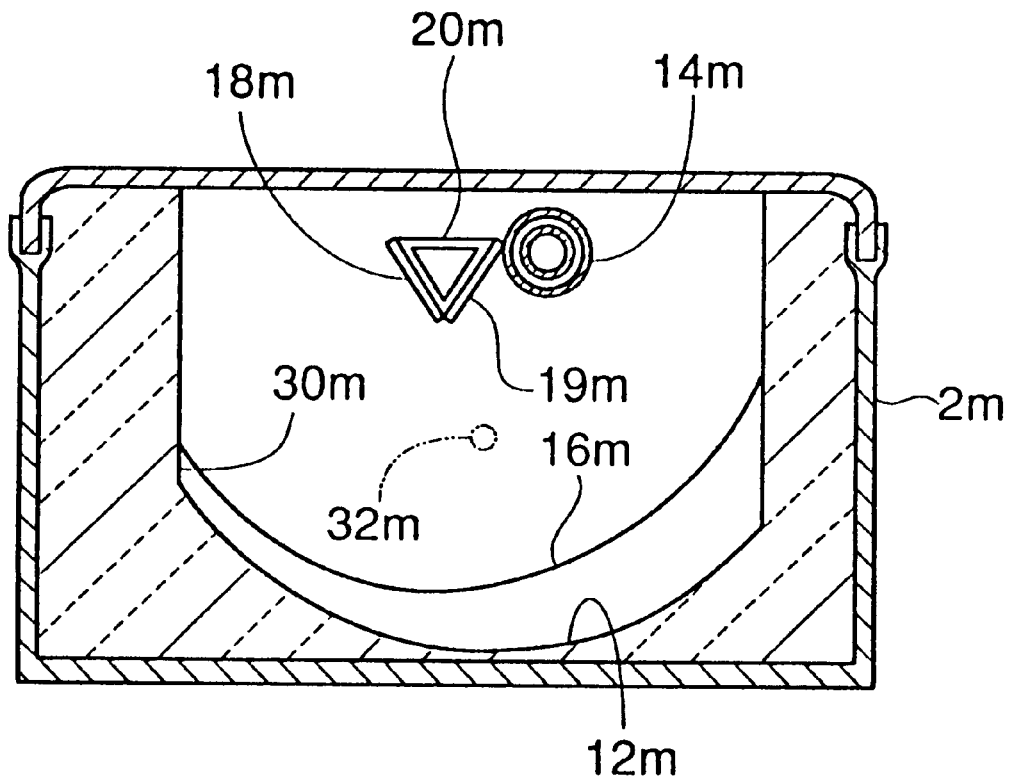
FIG. 9 shows a transverse sectional view of a hybrid solar collector according to a sixth embodiment.

FIG. 9 shows a transverse sectional view of a box type hybrid solar collector according to a sixth embodiment. The hybrid box is constituted of a box 2m having a reduced height. The box 2m is provided with a heat absorbing tube 14m and solar cells 18m and 19m which are positioned in substantially the same level. The box 2m receives a cooling water feeding tube 20m having a triangular configuration in cross section. The solar cells 18m and 19m are fixed on two walls of the cooling water feeding tube 20m. Reference numeral 16m in the drawing represents a selective reflection type parabolic mirror which reflects the short ray and transmits the long ray. Reference numeral 12m in the drawing represents a parabolic mirror which reflects the long ray. The parabolic mirrors 16m and 12m are arranged in non-parallel relation and are integrated to form a mirror unit having one end portion 30m where the parabolic mirrors 16m and 12m are combined with each other and having the other end where a clearance between the parabolic mirrors 16m and 12m is increased. It is important to note that the lower parabolic mirror 12m has a radius of curvature greater than that of the upper parabolic mirror 16m. Further, in this embodiment, the clearance between the parabolic mirrors 12m and 16m is filled with water glass, though the clearance can be filled with atmospheric air. Both parabolic mirrors 12m and 16m are suitably mounted on an axis 32m so as to rotate therearound. The parabolic mirrors 12m and 16m are controlled to trace the sun, so that the short ray is converged to the solar cells 18m and 19m and that the long ray is converged to the heat absorbing tube 14m.

This embodiment can be suitably modified. For example, the box can receive a structure shown in FIG. 5. The box is fixed to a desired location in use. In this case, the parabolic mirror shown in FIG. 5 is adapted to rotate around a focal point thereof in the box. Further, in this case, the transparent glass plate 2i is provided on an upper portion of the box. Similarly, the box can receive an optical system for separating and converging the solar rays shown in FIG. 4. In this case, the optical system is similarly controlled to trace the sun.

Figure 15:
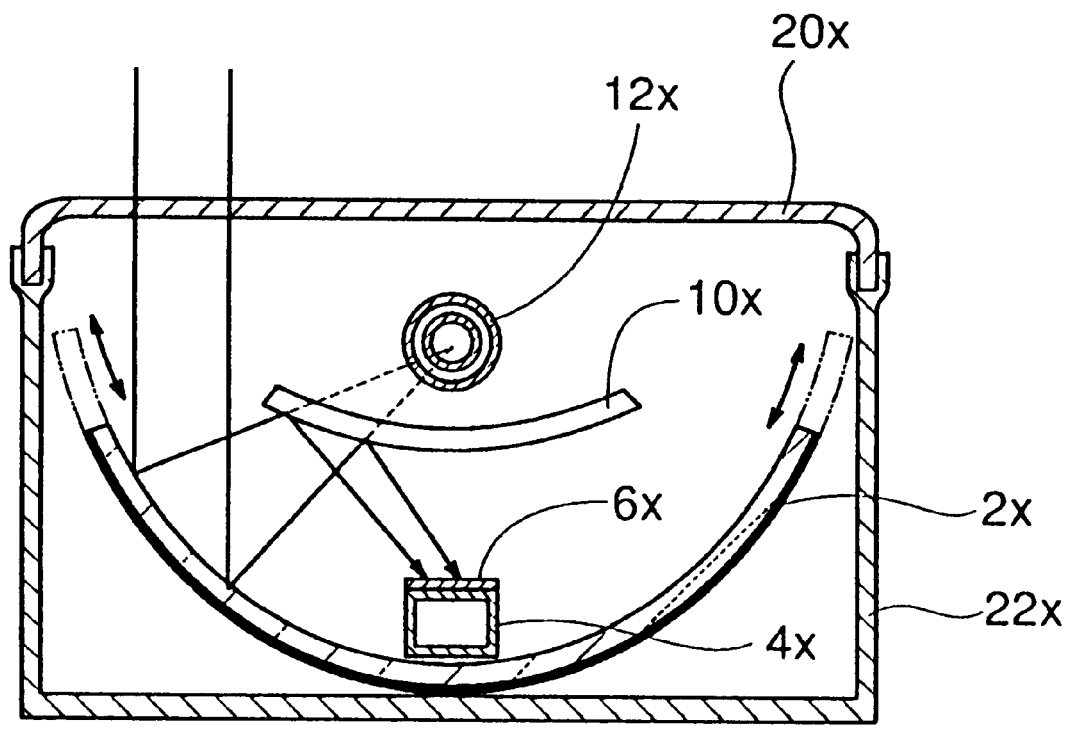
FIG. 15 shows a transverse sectional view of a hybrid solar collector according to a still further embodiment.

FIG. 15 shows a further modified form of the hybrid collector. The hybrid collector includes a box 22x which receives a hybrid structure therein. The reference number 2x in the drawing represents a parabolic mirror for reflecting all of the solar rays and for converging the reflected solar rays to its focal point. A heat absorbing tube 12x is located in the focal point of the parabolic mirror 2x. Located under the heat absorbing tube 12x is a semi-transparent parabolic mirror 10x having an increased radius of curvature. The parabolic mirror 10x selectively reflects the short ray in the solar rays reflected by the parabolic mirror 2x and converges the reflected short ray to a solar cell 6x. The parabolic mirror 10x has a predetermined radius of curvature so that the short ray is effectively converged to the solar cell 6x. Therefore, the solar cell 6x can be of a smaller type. All the other members are similar to those in the previously described embodiments. The box 22x is provided with a transparent plate 20x for covering an upper portion thereof. In this case, the parabolic mirror 10x and 2x and the solar cell 6x are adapted to rotate around the focal point of the parabolic mirror 2x so as to trace the sun.

Seventh Embodiment

Figure 10:
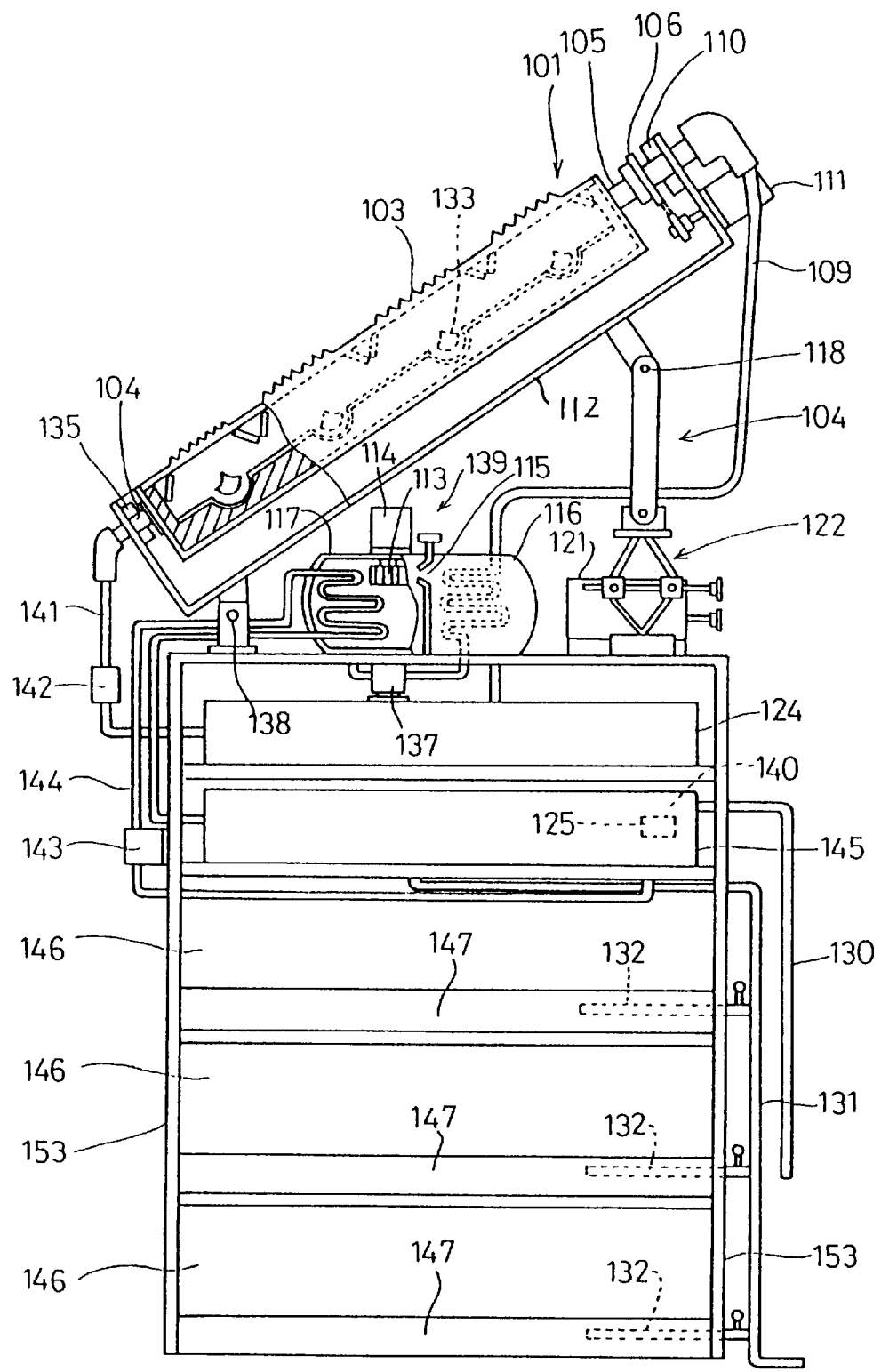
FIG. 10 shows a side view of a solar energy converting system with regard to a further embodiment.

FIG. 10 shows a seventh embodiment.

As shown in FIG. 10, an apparatus according to the present embodiment is mainly constituted of an upper panel assembly 101 and a support structure made of a plurality of stainless steel struts for supporting the panel assembly 101.

As shown in FIG. 10, the present apparatus also includes a plurality of hothouses 146 retained by four or more stainless steel struts 153. The hothouses 146 are intended to be used as greenhouses and are generally vertically arranged for ease of use. The panel assembly 101 is fixedly provided with an upper rotation axis 105 and a lower rotation axis 104 each of which is aligned to the central axis of the panel assembly 101. Further, the upper rotation axis 105 and the lower rotation axis 104 receive a heat-transfer medium outlet tube 109 and a feeder tube 141, respectively. The panel assembly 101 is rotatably retained on a panel support 112 through an upper bearing 110 and a lower bearing 135. Moreover, the panel support 112 includes a lower support portion and an upper support portion. The lower support portion is connected to a free motion joint 138 mounted on the support structure made of the stainless steel struts 153. On the other hand, the upper support portion is linked through a free motion joint 118 to a delta-type jack 122 mounted on the support structure. The jack 122 is connected to a geared motor 121 so that the panel assembly 101 is inclined to trace the sun.

Figure 11:
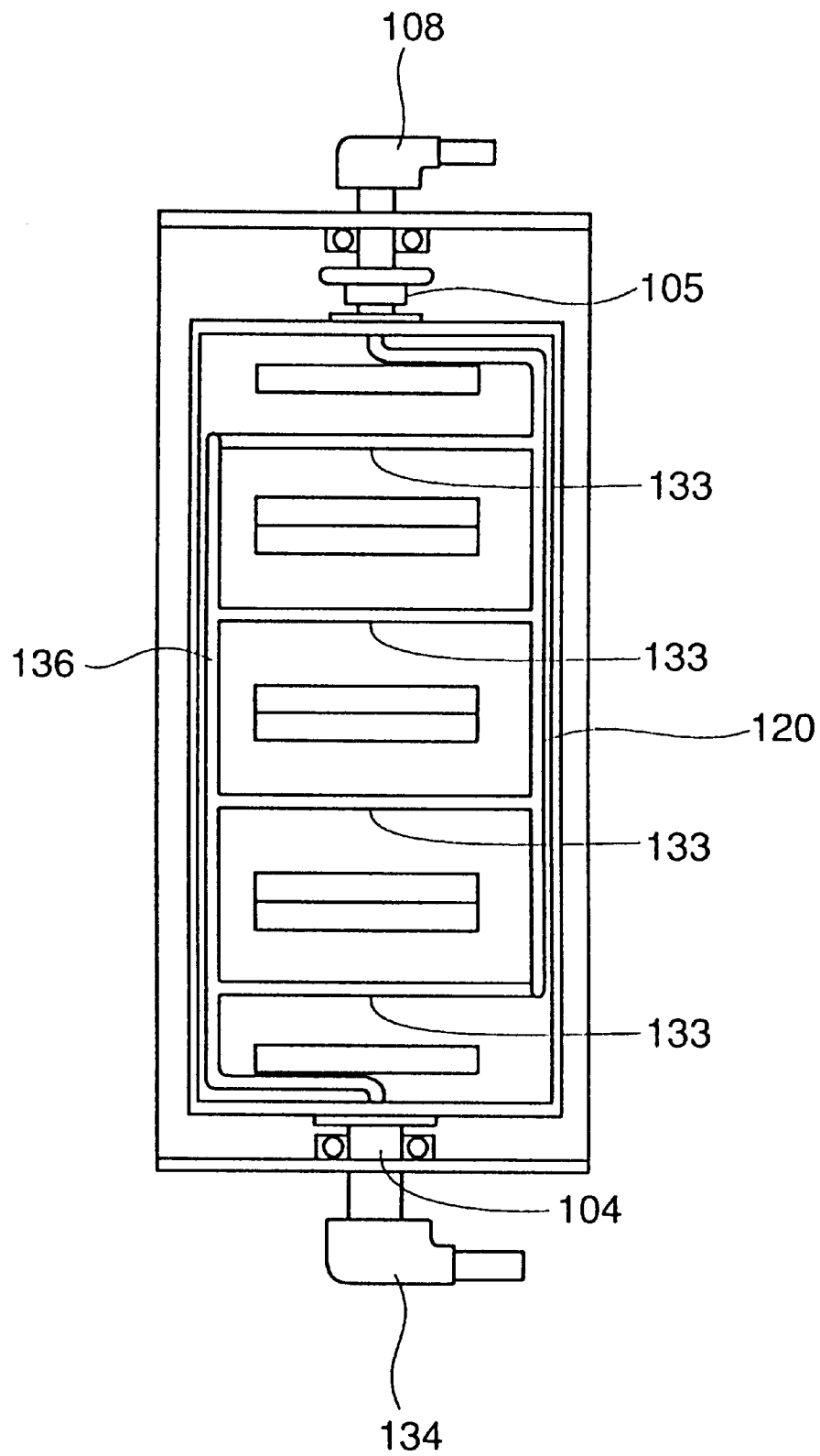
FIG. 11 shows a plan view of the solar energy converting system shown in FIG. 10.

The panel assembly 101 has a box-like shape and is provided with an acrylic resin plate on which Fresnel lenses 103 is formed. Each Fresnel lens 103 has a converging spot in which a heat absorbing tube 133 is positioned. The heat absorbing tubes 133 may absorb the long ray of the solar rays. As shown in FIG. 11, each heat absorbing tube 133 is horizontally arranged and has an inlet port coupled to an inlet manifold 136 and an outlet port coupled to an outlet manifold 120. The inlet manifold 136 passes through the lower rotation axis and is externally lead through a tube fitting 134. The outlet manifold 120 passes through the upper rotation axis and is externally lead through a tube fitting 108.

As shown in FIG. 10, the upper rotation axis 105 is fixedly provided with a sprocket wheel 106 which engages a geared motor 111 mounted on the panel support 112.

Figure 12:
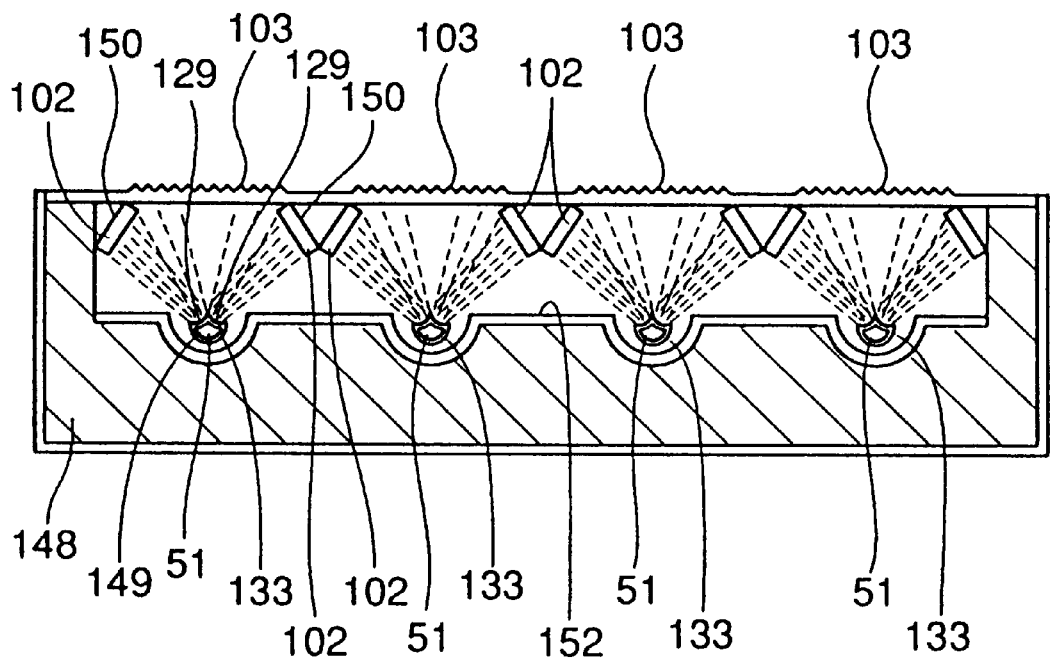
FIG. 12 shows a transverse sectional view of a hybrid solar collector of the solar energy converting system shown in FIG. 10.

As shown in FIG. 12, the heat absorbing tube 133 is arranged at a focal point or converging axis 51 of each Fresnel lens 103, and includes an inverted V-shaped upper half made of glass and having a pair of concave surfaces. Each concave surface is vapor deposited with a plurality of thin films of silicone, thereby forming a semi-transparent mirror 129 for selectively reflecting the short ray of the solar ray. The panel assembly 101 also includes a plurality of double-faced solar cells 102. The solar cells 102 are disposed in sides of the Fresnel lenses 103 and are arranged to form a substantially V-shape. Each semi-transparent mirror 129 divides the short ray of the solar ray into two parts and upwardly diagonally reflects the short ray 150. Each short ray 150 irradiates a rear surface of the corresponding solar cell 102, thereby generating electricity. Also, each solar cell 102 directly receives the solar ray at a top surface thereof to generate electricity.

The heat absorbing tube 133 includes a semicircular lower half made of glass or metal and integrally connected to the upper half having the semi-transparent mirror 129. The lower half receives a heat-transfer medium 149 formed of black antifreeze liquid which is composed of a solvent and finely granulated activated carbons dispersed in the solvent. The heat-transfer medium 149 is heated when passes through the lower half of the heat absorbing tube.

The panel assembly 101 is provided with a heat insulator 148 for covering a bottom surface and side surfaces. An aluminum reflector plate 152 is affixed to an outer surface of the heat insulator 148 to reflect the solar ray toward the heat absorbing tube, so that the solar rays are effectively used.

As shown in FIG. 10, a closed-type low temperature heating turbine 139 is positioned just under the panel support 112. The heating turbine 139 is a generating unit which can circulate a low-boiling point solvent within a sealed tank. The heating turbine 139 is constituted of an evaporating tank 116 and a cooling tank 117 communicated with the evaporating tank 116 through a restrictor valve 115. The evaporating tank 116 has an inner radiator connected to the heat-transfer medium outlet tube 109 to produce a supersaturated vapor of the low-boiling point solvent. On the other hand, the cooling tank 117 is provided with a generator 114 having an impeller 113 projected into the cooling tank 117. The supersaturated vapor rotates the impeller 113 when flowing through the restrictor valve 115, thereby actuating the generator 114 to generate electricity. The heat-transfer medium 149 is discharged into a heat-transfer medium reservoir tank 124 which is downwardly positioned and which is insulated with a heat insulator.

The cooling tank 117 receives a cooling water circulating tube which communicate with a warm water reservoir tank 145 at both ends thereof. The reservoir tank 145 is downwardly positioned and has a cavity 140 having a sufficient capacity. Cooling water 144 reserved in the cavity 140 of the reservoir tank 145 is circulated between the cooling tank 117 and the reservoir tank 145 by a cooling water circulating pump 143, that is, the cooling water 144 pumped by the pump 143 cools the vapors in the cooling tank 117 to a temperature not more than the boiling point and then returns to the reservoir tank 145. The liquefied low-boiling point solvents accumulated on the bottom of the cooling tank 117 are returned by a high pressure pump 137 to the evaporating tank 116 for reuse.

The warm water reservoir tank 145 is provided with a partition plate having a lower opening. The reservoir tank 145 communicates with a water-supply pipe 130 so that tap water is introduced thereinto. The water-supply pipe 130 is provided with a float valve 149 on an exit side thereof to control the amount of water to be fed into the reservoir tank 145. Further, the reservoir tank 145 communicates with a warm water supply tube 131 to supply warm water reserved in the cavity 140 for home use. The supply tube 131 additionally communicates with liquid fertilizer heater tubes 132. Each heater tube 132 is projected into a liquid fertilizer reservoir vessel 147 provided on a lower side of each hothouse 146, so that liquid fertilizer in the vessel 147 is warmed.

The heat-transfer medium reservoir tank 124 communicates with the feeder tube 141 through a heat-transfer medium circulating pump 142, so that the heat-transfer medium reserved therein is returned from the bottom of the tank 124 to the heat collector tube 133 of the panel assembly for reuse.

Figure 13:
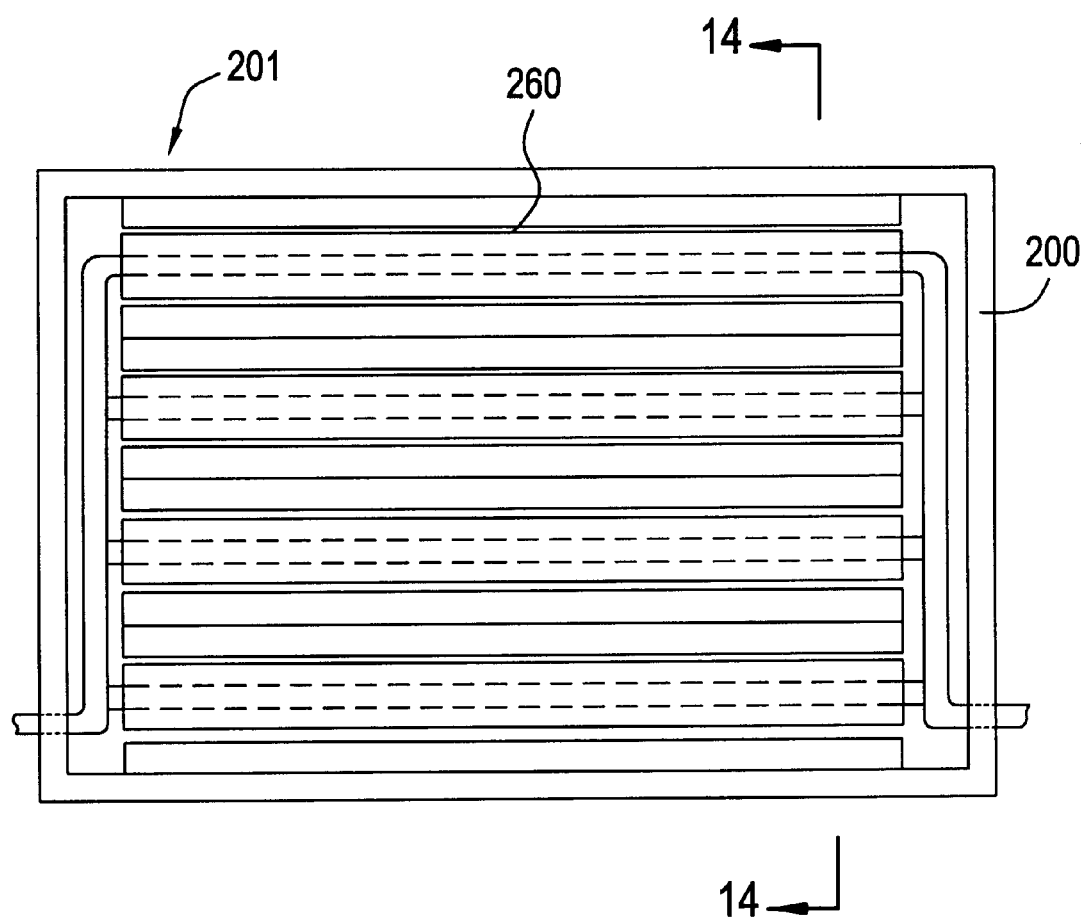
FIG. 13 shows a plan view of a solar energy converting system with regard to a still further embodiment.
Figure 14:
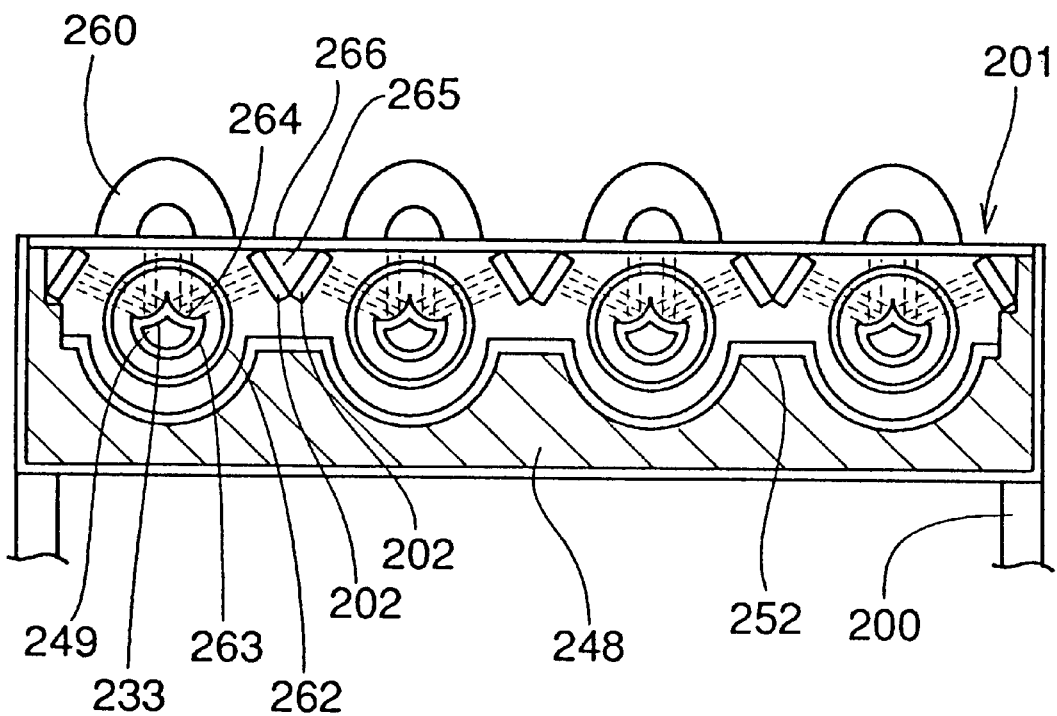
FIG. 14 shows a transverse sectional view of a hybrid solar collector utilized in the solar energy converting system shown in FIG. 13.

FIG. 13 shows a modified form of the present embodiment. Further, FIG. 14 shows a sectional view taken along line B—B of FIG. 13. A panel assembly 201 is fixed on a support structure made of stainless steel struts 200. The panel assembly 201 is inclined at about 40 degrees in order to direct to the sun. Further, the panel assembly 201 is provided with a panel glass plate 266 on which a plurality of horseshoe-shaped multi-layer focusing lenses 260 are mounted. Each focusing lens 260 has generally increased curvatures and is designed so that the curvatures are maximized in an innermost layer. The panel assembly further includes a plurality of double-faced solar cells 202 which are disposed in parallel between the lenses 260 and under the plate 266. The solar cells 202 are arranged in a V-shaped form by paring up.

As shown in FIG. 14, located under each horseshoe-shaped multi-layer focusing lens 260 is a semi-transparent curved mirror 264 for selectively reflecting the light of longer wavelength. The mirror 264 has a film of silicone vapor deposited on a rear surface thereof, so that the visible portion of the sunlight gathered by the focusing lens 260 is further converged to form a light flux 265 directed to the solar cell 202. The light flux 265 irradiates the rear surface of the solar cell 202, thereby generating electricity. Further, the solar cell 202 may directly receive the light at the top surface thereof to generate electricity.

The curved mirror 264 is a part of a heat collector tube 233. The heat collector tube 233 is made of glass or the like so as to absorb the longer wavelength portion of the light. The heat collector tube 233 receives a heat-transfer medium 249. The heat-transfer medium 249 is effectively heated by the infrared portion of the light when passes through the heat collector tube 233. Further, the heat collector tube 233 is sheathed by a glass tube 262 so that a vacuum space 263 is formed therearound, thereby forming a heat insulation barrier therearound.

The panel assembly 201 is provided with a heat insulator 248 made of glass wool or the like for covering a bottom surface and side surfaces. Further, an aluminum reflector plate 252 is provided on an outer surface of the heat insulator 248 so that the light is effectively utilized.

To operate the apparatus thus constructed, the panel assembly 201 is moved to direct to the sun. The sunlight highly gathered by the focusing lens 260 is separated to the visible portion and the longer wavelength or infrared portion by the semi-transparent mirror 264. The visible portion of the light irradiates the rear surface of the solar cell 202, thereby generating electricity. Additionally, the nongathered sunlight irradiates the top surface of the solar cell 202 to generate electricity.

The longer wavelength portion of the light effectively heats the heat-transfer medium 249 in the heat collector tube 233 to a higher temperature. The heated heat-transfer medium 249 heats low-boiling point solvent reserved in a closed-type low temperature heating turbine to produce a supersaturated vapor of the low-boiling point solvent, and is then reserved in a heat-transfer medium reservoir tank which is downwardly positioned. The vaporized low-boiling point solvent actuates a generator to generate electricity and is then returned to the heating turbine for reuse. It is to be noted that the low-boiling point solvent is completely circulated in the closed-type heating turbine.

In the modified apparatus shown in FIGS. 13 and 14, light-gathering power of the lenses is low since the lenses are of fixed type. However, such an apparatus can be constructed at a low cost.

Thus, the present apparatus is a multi-purpose light separating and selective converging type generating apparatus. In the apparatus, apart from the light-gathering power and the cost of the apparatus, the light is separated to the visible or generator light and the heater light, thereby permitting effective generation of electricity. On the other hand, the cooling water heated to lower temperatures is used as warm water. Further, the heat-transfer medium heated to higher temperatures may produce the warm water heated to higher temperatures. The highly heated warm water is utilized in the hothouses downwardly located to promote plant growth in the hothouses, thereby increasing plant production.

As described above, the multi-purpose light separating and selective converging type generating apparatus can be combined with the vertically arranged hothouses which is located thereunder, the warm water reservoir tank arranged on the hothouses, and the heat-transfer medium reservoir tank. The light is separated to the generator light and the heater light by the converging lenses in the panel assembly to effectively utilize thermal energy of the light. The heater light effectively heats the heat-transfer medium to higher temperatures, thereby permitting generation of electricity. The generator light irradiates the solar cells, thereby effectively generating electricity. Further, the cooling water heated to lower temperatures is used as warm water. The cooling water heated to higher temperatures is utilized in the hothouses to promote plant growth in the hothouses. Thus, the present apparatus permits early repayment of the cost.

What is claimed is:

1. A hybrid solar collector for generating electricity and heat, and utilizing solar radiation having short rays and long rays, comprising:

a short ray reflecting mirror, wherein the short ray reflecting mirror substantially transmits all the long rays in the solar radiation and converges the short rays upon a first focal point, a solar cell disposed substantially at the first focal point and converting energy from the converged short rays into electricity, a long ray reflecting mirror disposed so as to receive the long rays transmitted by the short ray reflecting mirror, the long ray reflecting mirror converges the long rays upon a second focal point and a heat absorbing tube disposed substantially at the second focal point and converting energy from the converged long rays into heat, wherein the hybrid solar collector is constructed such that the solar cell is closest to the sun in operation, the short ray reflecting mirror is next closest to the sun in operation, the heat absorbing tube is behind the short ray reflecting mirror and the long ray reflecting mirror is furthest from the sun in operation.

2. A hybrid solar collector as in claim 1, further comprising a glass tube, wherein the short ray reflecting mirror, the solar cell and the heat absorbing tube are enclosed within the glass tube.

3. A hybrid solar collector as in claim 2, wherein the long ray reflecting mirror is formed on a surface of the glass tube.

4. A hybrid solar collector as in claim 3, further comprising means for rotating the glass tube in response to movement of the sun.

5. A hybrid solar collector as in claim 4, further comprising a cooling conduit disposed adjacent to the solar cell.

6. A hybrid solar collector as in claim 5 further comprising:
a pressure tank containing a low boiling point medium;
a heat exchanger in communication with a high boiling point medium in the heat absorbing tube and the low boiling point medium, wherein heat from the high boiling point medium is transferred to the low boiling point medium in the heat exchanger to form a low boiling point medium vapor;
a turbine in communication with low boiling point medium vapor, wherein pressure from the low boiling point medium vapor drives the turbine to thereby generate electricity; and
a cooling chamber disposed downstream from the turbine and receiving and cooling the low boiling point vapor.

7. A hybrid solar collector as in claim 6, wherein the cooling chamber comprises a heat exchanger that utilizes remaining heat from the low boiling point medium vapor to heat water.

8. An apparatus comprising:
a glass pipe comprising an upper half having a circular cross section and a lower half having a parabolic cross section, wherein an aluminum coating is deposited on the parabolic lower half;
a first heat absorbing tube containing a high boiling point heat transfer medium;
a solar cell;
a parabolic mirror disposed within the glass pipe and above the heat absorbing tube, the parabolic mirror having a property of reflecting wavelengths not greater than 9000 Angstroms while transmitting wavelengths greater than 9000 Angstroms, wherein wavelengths transmitted by the parabolic mirror are focused by the parabolic lower half of the glass pipe onto the heat absorbing tube, and wherein the parabolic mirror focuses the wavelengths that are not greater than 9000 Angstroms on the solar cell; and
a second heat absorbing tube contacting the solar cell and containing a medium for cooling the solar cell.

9. An apparatus as in claim 8, wherein the first heat absorbing tube comprises an inner tube and an outer tube separated from the inner tube by a vacuum clearance.

10. An apparatus as in claim 8, wherein the parabolic mirror comprises a plurality of vapor deposited silicone films.

11. An apparatus as in claim 8, further comprising end plates disposed at each end of the glass pipe, wherein the end plates fix the first heat absorbing tube, the second heat absorbing tube and the parabolic mirror.

12. An apparatus as in claim 8, further comprising:
a sensor, wherein the sensor generates varying signals based upon changes in the position of the sun; and
a motor coupled to the sensor and to the glass pipe, wherein the motor moves the glass pipe in response to the signals from the sensor.

13. An apparatus as in claim 8, further comprising:
a pressure tank containing a low boiling point medium;
a heat exchanger in communication with the high boiling point heat transfer medium and the low boiling point medium, wherein heat from the high boiling point heat transfer medium is transferred to the low boiling point medium in the heat exchanger to form a low boiling point medium vapor;
a turbine in communication with low boiling point medium vapor, wherein pressure from the low boiling point medium vapor drives the turbine to thereby generate electricity; and
a cooling chamber disposed downstream from the turbine and receiving and cooling the low boiling point vapor.

14. An apparatus as in claim 8, further comprising:
end plates disposed at each end of the glass pipe, wherein the end plates fix the first heat absorbing tube, the second heat absorbing tube and the parabolic mirror;
a sensor, wherein the sensor generates varying signals based upon changes in the position of the sun; and
a motor coupled to the sensor and to the glass pipe, wherein the motor moves the glass pipe in response to the signals from the sensor;
wherein the first heat absorbing tube comprises an inner tube and an outer tube separated from the inner tube by a vacuum clearance and the parabolic mirror comprises a plurality of vapor deposited silicone films.

15. An apparatus comprising:
a glass pipe comprising an upper half having a circular cross section and a lower half having a parabolic cross section, wherein an aluminum coating is deposited on the parabolic lower half and the parabolic lower half has a first focal point wherein wavelengths greater than 9000 Angstroms are converged;
a first heat absorbing tube disposed at the first focal point, comprising an inner tube and an outer tube separated from the inner tube by a vacuum clearance, wherein a high boiling point heat transfer medium passes through the inner tube;
a parabolic mirror disposed within the glass pipe and above the heat absorbing tube, the parabolic mirror comprising a plurality of vapor deposited silicone films and having a property of reflecting wavelengths not greater than 9000 Angstroms while transmitting wavelengths greater than 9000 Angstroms, wherein wavelengths transmitted by the parabolic mirror are focused by the parabolic lower half of the glass pipe onto the heat absorbing tube, and wherein the parabolic mirror focuses the wavelengths that are not greater than 9000 Angstroms on a second focal point;
a solar cell disposed at the second focal point;
a second heat absorbing tube contacting the solar cell and containing a medium for cooling the solar cell;
end plates disposed at each end of the glass pipe, wherein the end plates fix the first heat absorbing tube, the second heat absorbing tube and the parabolic mirror;
a sensor, wherein the sensor generates varying signals based upon changes in the position of the sun;
a motor coupled to the sensor and to the glass pipe, wherein the motor moves the glass pipe in response to the signals from the sensor;
a pressure tank containing a low boiling point medium;
a heat exchanger in communication with the high boiling point heat transfer medium and the low boiling point medium, wherein heat from the high boiling point heat transfer medium is transferred to the low boiling point medium in the heat exchanger to form a low boiling point medium vapor;
a turbine in communication with low boiling point medium vapor, wherein pressure from the low boiling point medium vapor drives the turbine to thereby generate electricity; and
a cooling chamber disposed downstream from the turbine and receiving and cooling the low boiling point vapor.

* * * * *